United States Patent [19]
Takagi

[11] Patent Number: 5,600,591
[45] Date of Patent: Feb. 4, 1997

[54] DYNAMIC RANDOM ACCESS MEMORY AND MANUFACTURING METHOD THEREOF

[75] Inventor: Hiroshi Takagi, Hyogo-ken, Japan

[73] Assignee: Mitsubishi Denki Kabushiki Kaisha, Tokyo, Japan

[21] Appl. No.: 512,074

[22] Filed: Aug. 7, 1995

Related U.S. Application Data

[63] Continuation of Ser. No. 49,728, Apr. 21, 1993.

[30] Foreign Application Priority Data

Apr. 24, 1992 [JP] Japan ..................................... 4-106831

[51] Int. Cl.$^6$ ................................................. G11C 13/00
[52] U.S. Cl. ...................... 365/184; 365/179; 365/189.01
[58] Field of Search .................................... 365/179, 184, 365/189.01

[56] References Cited

U.S. PATENT DOCUMENTS

| | | | |
|---|---|---|---|
| 3,593,037 | 7/1971 | Hoff | 365/182 |
| 3,614,749 | 10/1971 | Radcliffe | 365/182 |
| 3,706,079 | 12/1972 | Vadasz | 365/182 |
| 3,868,654 | 2/1975 | Itoh | 365/182 |
| 4,021,788 | 5/1977 | Marr | 365/182 |
| 4,503,519 | 3/1985 | Arakawa | 365/185 |
| 5,181,188 | 1/1993 | Yamaguchi et al. | 365/185 |
| 5,293,563 | 3/1994 | Ohta | 365/149 |

FOREIGN PATENT DOCUMENTS

| | | |
|---|---|---|
| 350057 | 1/1990 | European Pat. Off. . |
| 4109774 | 10/1991 | Germany . |
| 61-23361 | 1/1986 | Japan . |
| 63-184361 | 7/1988 | Japan . |
| 64-9653 | 1/1989 | Japan . |

Primary Examiner—Terrell W. Fears
Attorney, Agent, or Firm—Lowe, Price, LeBlanc & Becker

[57] ABSTRACT

A memory cell structure with the reduced number of bit line contacts, contributing to high integration and high reliability of a DRAM is provided. Each of memory cells (M1, M2, M3, M4) of the DRAM includes a field effect transistor and a capacitor (I, II, III, IV) connected thereto. The field effect transistor constituting each of the memory cells has a combination of two gates: a transfer gate (A) of a low Vth and a sub-transfer gate (a) of a high Vth, a transfer gate (B) of a high Vth and a sub-transfer gate (b) of a low Vth, a transfer gate (C) of a high Vth and a sub-transfer gate (c) of a low Vth, and a transfer gate (D) of a low Vth and a sub-transfer gate (d) of a high Vth. The four memory cells share a bit line contact.

11 Claims, 17 Drawing Sheets

DYNAMIC RANDOM ACCESS MEMORY AND MANUFACTURING METHOD THEREOF

This application is a continuation of application Ser. No. 08/049,728 filed Apr. 21, 1993.

BACKGROUND OF THE INVENTION

1. Field of the Invention

The present invention relates to semiconductor memory devices and a manufacturing method thereof, and more specifically to improvements and a manufacturing method of a high integrated structure of a semiconductor memory device, such as a dynamic random access memory (DRAM), having a memory cell structure including a field effect transistor and a capacitor.

2. Description of the Background Art

Recently, demand for a semiconductor memory device has been rapidly expanding with a remarkable spread of information equipments such as a computer. In addition, a large memory capacity and high speed operation are functionally requested. Under these circumstances, technology has been developed in respect to high integration and fast response or high reliability of a semiconductor memory device.

Among semiconductor memory devices, a DRAM (Dynamic Random Access Memory) is known which can randomly input/output information. A DRAM is generally comprises a memory cell array which is a storage region for storing a multiplicity of information, and peripheral circuitry required for communication between the storage region and outside.

FIG. 25 is a block diagram showing a general structure of a DRAM. Referring to FIG. 25, a DRAM includes a memory cell array 58, an address buffer 54, a row decoder 55 and a column decoder 56, and a sense amplifier 63. Memory array 58 includes a plurality of memory cells for storing a data signal of information. Address buffer 54 externally receives address signals $A_0$ to $A_9$ for selecting a memory cell constituting a unitary storage circuit. Row decoder 55 and column decoder 56 decode an address signal to designate the memory cell. Sense amplifier 63 is connected to memory array 58 for amplifying and reading a signal stored in the designated memory cell. An input buffer 59 and an output buffer 60 are connected through an I/O gate 57 to memory array 58. Input buffer 59 inputs a data signal. Output buffer 60 outputs a data signal. Address buffer 54 is connected so as to receive external address signals ext. $A_0$ to $A_9$ or internal address signals $Q_0$ to $Q_8$ generated from a refresh counter 53. A refresh controller 52 responds to a timing of a signal applied to a clock generator 51 to drive refresh counter 53. Clock generator 51 generates a clock signal which is a control signal to each section.

Memory array 58 occupying a large area on the semiconductor chip comprises a plurality of memory cells arranged in a matrix for storing unitary store information. FIG. 26 is a schematic diagram showing an equivalent circuit of four-bit memory cells constituting memory array 58. Memory array 58 comprises a plurality of word lines 301a, 301b, 301c, and 301d extending in parallel in a row direction, and a plurality of bit lines 302a and 302b extending in parallel in a column direction. Memory cells 303 are formed near intersections of word lines 301a to 301d and bit lines 302a and 302b. Each memory cell 303 comprises a MOS (metal oxide semiconductor) transistor 304 and a capacitor 305, which is a so-called one transistor-one capacitor type memory cell. A memory cell of this type facilitates, because of its simple structure, enhancement of integration of a memory array, and thus, is often employed in a DRAM of a large capacity. A pair of bit lines 302a and 302b shown in FIG. 26 arranged in parallel with sense amplifier 63 is referred to as a folded bit line type.

With reference to FIG. 26, MOS transistor 304 has its gate electrode connected to word line 301a, one source/drain electrode connected to one electrode of capacitor 305, and the other source/drain electrode connected to bit line 302a. In writing data, a prescribed voltage is applied to word line 301a, rendering MOS transistor 304 conductive, so that charges applied to bit line 302a are stored in capacitor 305. In reading data, a prescribed voltage is applied to word line 301a, rendering MOS transistor 304 conductive, so that charges stored in capacitor 305 are withdrawn through bit line 302a.

FIG. 27 shows an example of a partial planar arrangement of the DRAM shown in the equivalent circuit of FIG. 26. In FIG. 27, four memory cells are shown, each memory cell comprising one of MOS transistors Q1, Q2, Q3, and Q4 and one of capacitors Cs1, Cs2, Cs3, and Cs4, formed in one of operation areas A1, A2, A3, and A4, respectively. A gate electrode constituting each of transistors Q1–A4 comprises a part of one of word lines 301a to 301d corresponding to each memory cell. Over word lines 301a–301d, bit lines 302a and 302b are so formed as to be insulated from and cross word lines 301a–301d. Bit lines 302a and 302b are connected to the memory cell through contact holes C1, C2, and C3.

FIG. 28 is one example of a cross sectional view showing a structure of the memory cell taken along the 28—28 line in FIG. 27. FIG. 28 shows two-bit memory cells 303. Memory cell 303 comprises one MOS transistor 304 and one capacitor 305. MOS transistor 304 comprises a pair of source/drain regions 306a and 306b formed spaced apart from each other in a silicon substrate 340, and a gate electrode 308 (301b, 301c) formed on the surface of silicon substrate 340 with a gate oxide film 307 interposed therebetween. Capacitor 305 comprises a lower electrode (storage node) 309 connected to one of source/drain regions 306a of MOS transistor 304, a dielectric layer 310 formed on the upper surface of lower electrode 309, and an upper electrode (cell plate) 311 covering the upper surface of the electric layer 310. Lower electrode 309 and upper electrode 311 are made of polysilicon, for example. A capacitor of this stacked structure is referred to as a stacked capacitor. Stacked capacitor 305 has one end extended onto the upper portion of gate electrode 308 with an insulating film 312 interposed therebetween, and the other end extended onto the upper portion of a field oxide film 313. The surface of silicon substrate 340 on which capacitor 305 and the like are formed is covered with a thick interlayer insulating film 314. Bit line 302b formed on interlayer insulating film 314 is connected to the other of source/drain regions 306b of MOS transistor 304 through a contact hole 315.

In the memory cell structure of the DRAM shown in FIGS. 27 and 28, one contact hole 315 is formed for two memory cells 303, 303 (two bits). That is, one bit line contact is formed for two bits. Therefore, as high integration and miniaturization of the memory cell structure of the DRAM progress, contact hole 315 must be made smaller as possible. This leads to increase of contact resistance. Further, with the contact hole being smaller, an interconnection material to the contact portion can not be sufficiently buried, which leads to reduction of reliability. Additionally, as high integration and miniaturization of the memory cell structure of the DRAM progress, a space between bit lines becomes narrower, which makes very difficult to process the bit lines.

SUMMARY OF THE INVENTION

One object of the present invention is to provide a memory cell structure which contributes to high integration of a DRAM.

Another object of the present invention is to prevent reduction of reliability caused by high integration of a DRAM and miniaturization of a memory cell.

Still another object of the present invention is to prevent increase of contact resistance caused by high integration of a DRAM and miniaturization of a memory cell.

A further object of the present invention is to reduce the number of bit line contacts in a DRAM.

A DRAM in accordance with the present invention is a DRAM having a plurality of memory cells on a main surface of a semiconductor substrate, each of the memory cells including a field effect transistor and a capacitor connected thereto. The field effect transistor includes a first gate electrode having a first threshold voltage and a second gate electrode having a second threshold voltage different from the first threshold voltage.

In the present invention, the field effect transistor constituting the memory cell includes two gate electrodes having different threshold voltages, respectively. The first gate electrode is supplied with either a lower voltage or a higher voltage than the first threshold voltage, so that the first gate can be opened and closed. The second gate electrode is supplied with either a lower voltage or a higher voltage than the second threshold voltage, so that the second gate is opened and closed. There are four combinations of voltages applied to the first gate electrode and the second gate electrode, respectively. Only when a higher voltage than the first threshold voltage is applied to the first gate electrode and a higher voltage than the second threshold voltage is applied to the second gate electrode, the first gate and the second gate open, and a capacitor connected to the field effect transistor can store or withdraw charges. A bit line is connected to a source/drain electrode of the field effect transistor on the opposite side which is not connected to the capacitor. As described above, voltages applied to the first gate electrode and the second gate electrode are combined, and only one combination of applied voltages among four of them enables the field effect transistor connected to the capacitor to be conductive. According to the four combinations of applied voltages, one field effect transistor can thus be selected among the four field effect transistors and rendered conductive, enabling the four field effect transistors to be connected to one bit line. That is, four memory cells can be connected to one bit line. This makes it possible to reduce the number of bit line contacts, from one for two memory cells (two bits) to one for four memory cells (four bits). Consequently, the number of bit lines is reduced by half, resulting in increase of an occupied area of a bit line contact in a region between bit lines, with a larger margin than a conventional one. This leads to decrease in a contact resistance. Furthermore, since the number of bit lines can be reduced by half, a space between bit lines can have a margin in processing of the bit lines.

As described above, the number of bit line contacts can be reduced compared to the prior art, so that difficulty in processing of a bit line and increase in a contact resistance caused by high integration of a DRAM and miniaturization of a memory cell structure of a DRAM can be solved, enabling higher reliability of a DRAM.

In accordance with a preferred embodiment of a DRAM of the present invention, the first gate electrodes are interconnected among the plurality of memory cells. In the field effect transistor, the first gate electrode and the second gate electrode are formed insulated and adjacent to each other on the main surface of a semiconductor substrate with a gate insulating film interposed therebetween. The field effect transistor includes first and second impurity regions formed spaced from each other by the first and second gate electrodes, on the main surface of the semiconductor substrate. The first impurity region is shared among four memory cells.

A manufacturing method of a DRAM in accordance with the present invention includes the following steps. A capacitor is formed on the main surface of a silicon substrate. A first gate electrode having a first threshold voltage is formed spaced apart from the capacitor on the main surface of the semiconductor substrate, with a gate insulating film interposed therebetween. A second gate electrode having a second threshold voltage different from the first threshold voltage is formed insulated from and adjacent to the first gate electrode, on the main surface of the semiconductor substrate with a gate insulating film interposed therebetween. A first impurity region is formed near the first gate electrode on the main surface of the semiconductor substrate. A second impurity region is formed near the second gate electrode on the main surface of the semiconductor substrate, so as to connect with the capacitor.

In accordance with a preferred embodiment of a manufacturing method of a DRAM of the present invention, impurities are introduced in the main surface of a semiconductor substrate for adjustment of a threshold voltage, whereby first and second gate electrodes having different threshold voltages are formed.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
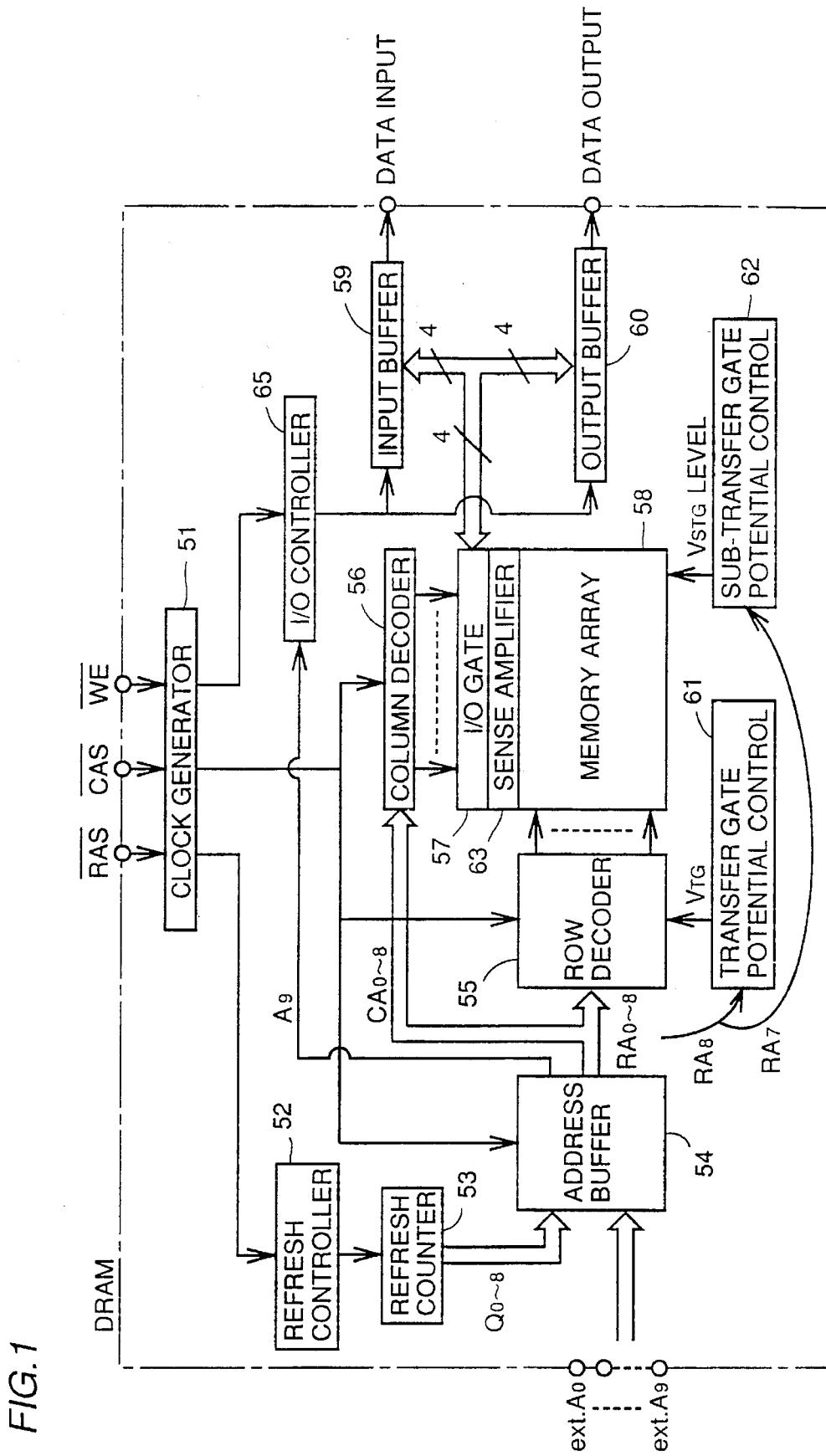
FIG. 1 is a block diagram showing the entire structure of a dynamic random access memory (DRAM) of the present invention.

Referring to FIG. 1, a DRAM includes a memory array 58, an address buffer 54, a row decoder 55 and a column decoder 56, and a sense amplifier 63. Memory array 58 includes a plurality of memory cells for storing a data signal. Address buffer 54 receives an address signal for selecting a memory cell. Row decoder 55 and column decoder 56 decode an address signal to designate a memory cell. Sense amplifier 63 is connected to memory array 58 for amplifying and reading a signal stored in a memory cell. Input buffer 59 and output buffer 60 are connected to memory array 58 through an I/O gate 57 for inputting/outputting data.

Address buffer 54 is connected so as to receive external address signals ext. $A_0$–$A_9$ or internal address signals $Q_0$–$Q_8$ generated by a refresh counter 53. Row decoder 55 is connected to address buffer 54 so as to receive row address signals $RA_0$–$RA_8$ generated by address buffer 54. The row address signals $RA_7$, $RA_8$ generated by address buffer 54 are applied to a transfer gate potential control circuit 61 and a sub-transfer gate potential control circuit 62. In response to these row address signals $RA_7$ and $RA_8$, transfer gate potential control circuit 61 applies a transfer gate potential level $V_{TG}$ to row decoder 55, and sub-transfer gate potential control circuit 62 applies a sub-transfer gate potential level $V_{STG}$ to memory array 58. The peripheral control portion of the DRAM of the present invention is thus provided, in addition to conventional functions, with control circuits for a sub-transfer gate potential and a transfer gate potential.

Figure 2:
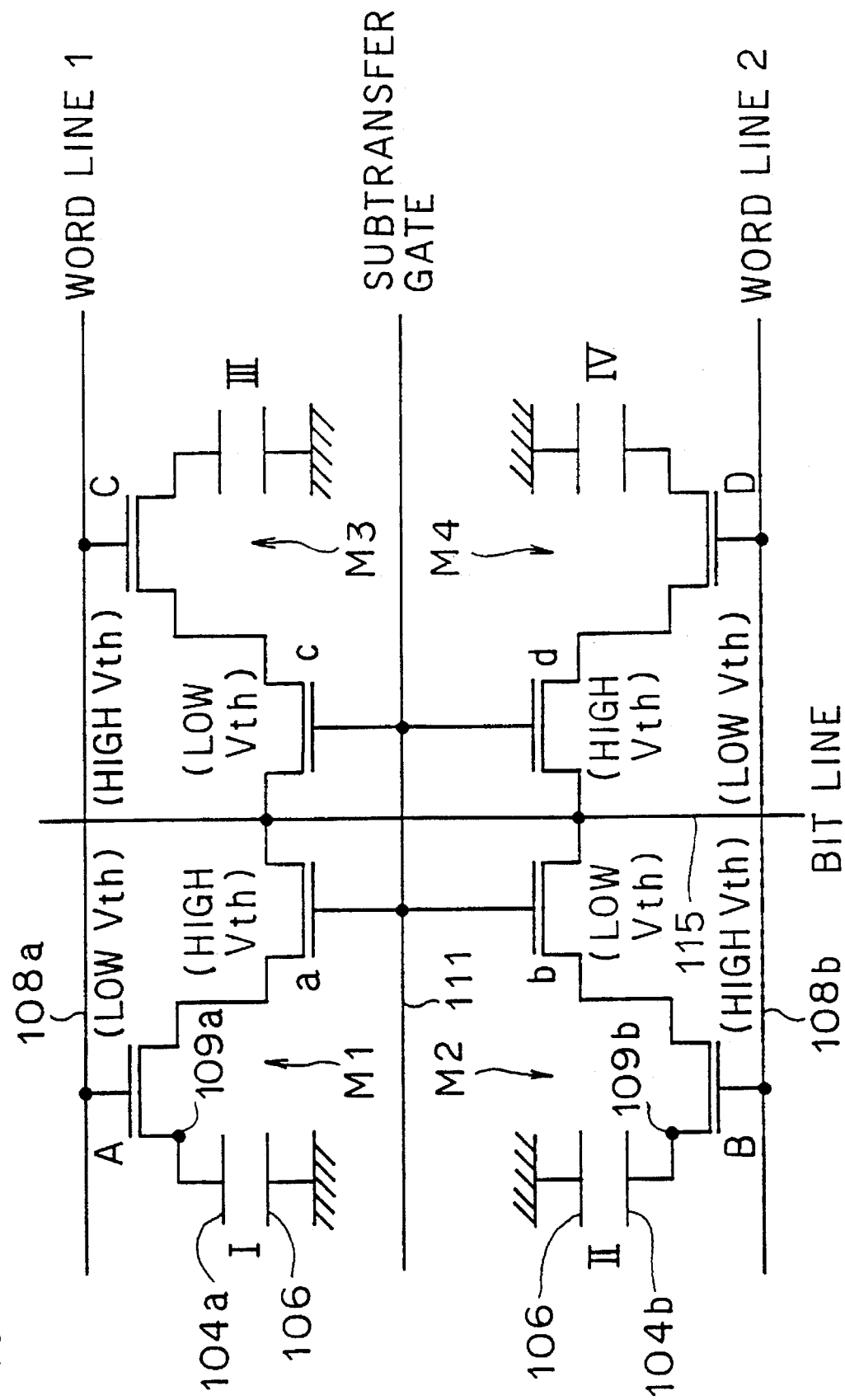
FIG. 2 is a schematic diagram of an equivalent circuit showing four-bit memory cells of a memory array of the DRAM of the present invention.

An equivalent circuit of four-bit memory cells constituting memory array 58 of FIG. 1 is shown in FIG. 2. The memory array includes a plurality of word lines extending in parallel in a row direction, and a plurality of bit lines extending in parallel in a column direction. In the memory array of the present invention, four memory cells M1, M2, M3, M4 are formed in the vicinity of intersections of two word lines 1 and 2 and a bit line as shown in FIG. 2. Four memory cells M1–M4 are connected to the same bit line 115. Memory cell M1 includes an MOS transistor including a transfer gate A and a sub-transfer gate a, and a capacitor I. Memory cell M2 includes an MOS transistor including a transfer gate B and a sub-transfer b, and a capacitor II. Memory cell M3 includes an MOS transistor including a transfer gate C and a sub-transfer gate c, and a capacitor III. Memory cell M4 includes an MOS transistor including a transfer gate D and a sub-transfer d, and a capacitor IV. Each sub-transfer gates a–d are interconnected. Transfer gates A and D have low threshold voltages (Vth) and transfer gates B and C have high threshold voltages, respectively. Sub-transfer gates a and d have high threshold voltages and sub-transfer gates b and c have low threshold voltages, respectively. Transfer gates A and C are connected to word line 1 (108a), and transfer gates b and d are connected to word line 2 (108b). All sub-transfer gates are connected to the same sub-transfer gate line 111 in the memory array.

Referring to FIG. 2, a method of selecting any of four capacitors I–IV will now be described. Table 1 shows voltage levels applied to word lines 1 and 2 and subtransfer gates for selecting any of four capacitors I–IV.

TABLE 1

| capac-itor | word line 1 | word line 2 | sub-transfer gate | gate open | row address signal RA₇ | RA₈ |
|---|---|---|---|---|---|---|
| I | middle level (approximately 3V) | low level (0V) non-selected | high level (approximately 5V) | A and a | 0 | 0 |
| II | low level (0V) non-selected | high level (approximately 5V) | middle level (approximately 3V) | B and b | 0 | 1 |
| III | high level (approximately 5V) | low level (0V) non-selected | middle level (approximately 3V) | C and c | 1 | 0 |
| IV | low level (0V) non-selected | middle level (approximately 3V) | high level (approximately 5V) | D and d | 1 | 1 |

Referring to FIG. 2 and Table 1, a selecting method of a capacitor will be described. First, in the case of selecting capacitor I, a middle level (approximately 3 V) voltage, which is between a high threshold voltage and a low threshold voltage of the transfer gate, is applied to word line 1, whereby transfer gate A opens and transfer gate C remains closed. A low level (0 V) voltage, which is lower than the low threshold voltage of the transfer gate, is applied to word line 2, whereby transfer gates B and D remain closed. That is, word line 2 is in a non-selected condition. A high level (approximately 5 V) voltage, which is higher than the high threshold voltage of the sub-transfer gate, is applied to sub-transfer gate 111, whereby all sub-transfer gates a–d open. Therefore, only the MOS transistor in which transfer gate A and sub-transfer gate a open is rendered conductive, and thus capacitor I is selected. As a result, in writing data, charges applied to bit line 115 are stored in capacitor I, and in reading data, charges stored in capacitor I are withdrawn through bit line 115.

In the case of selecting capacitor II, a low level (0 V) voltage is applied to word line 1, whereby transfer gates A and C remain closed. That is, word line 1 is in a non-selected condition. A high level (approximately 5 V) voltage, which is higher than the high threshold voltage of the transfer gate, is applied to word line 2, whereby transfer gates B and D open. A middle level (approximately 3 V) voltage, which is between the high threshold voltage and the low threshold voltage of the sub-transfer gate, is applied to sub-transfer gate 111, whereby sub-transfer gates b and c open. Therefore, only the MOS transistor in which transfer gate b and subtransfer gate b open is rendered conductive, and thus capacitor II is selected.

In the case of selecting capacitor III, a high level (approximately 5 V) voltage is applied to word line 1, whereby transfer gates A and C open. A low level (0 V) voltage is applied to word line 2, whereby transfer gates B and D remain closed. That is, word line 2 is in a non-selected condition. A middle level (approximately 3 V) voltage is applied to sub-transfer gate 111, whereby sub-transfer gates b and c open. Therefore, only the MOS transistor in which transfer gate C and sub-transfer gate c open is rendered conductive, and thus capacitor III is selected.

In the case of selecting capacitor IV, a low level (0 V) voltage is applied to word line 1, whereby transfer gates A and C remain closed. That is, word line 1 is in a non-selected condition. A middle level (approximately 3 V) voltage is applied to word line 2, whereby transfer gate D opens. A high level (approximately 5 V) voltage is applied to sub-transfer gate 111, whereby all sub-transfer gates a–d open. Therefore, only the MOS transistor in which transfer gate D and sub-transfer gate d open is rendered conductive, and thus capacitor IV is selected.

Address information concerning selection of a memory, that is, a capacitor, as described above is processed as follows. Referring to FIG. 1, address information concerning a memory cell which is to read/write is held in address buffer 54, and m-bit memory cells are coupled to sense amplifiers 63 through a bit line by selecting a specific word line by row decoder 55 (selection of one word line out of n word lines). A specific bit line is then selected by column decoder 56 (selection of one bit line out of m bit lines), and one of the sense amplifiers is coupled to an input/output circuit, and reading or writing is carried out according to a command of the control circuit.

In the present invention, however, referring to FIG. 1 and table 1, one memory cell is selected out of four memory cells connected to one bit line according to a combination of the row address signals $RA_7$, $RA_8$ applied from address buffer 54. In other words, transfer gate potential control circuit 61 controls a voltage to be applied to a word line according to a combination of two least significant digits of the row address signals ($RA_7$, $RA_8$). Sub-transfer gate potential control circuit 62 controls a voltage to be applied to a sub-transfer gate according to a combination of two least significant digits of the row address signals.

Embodiment 1

Figure 3:
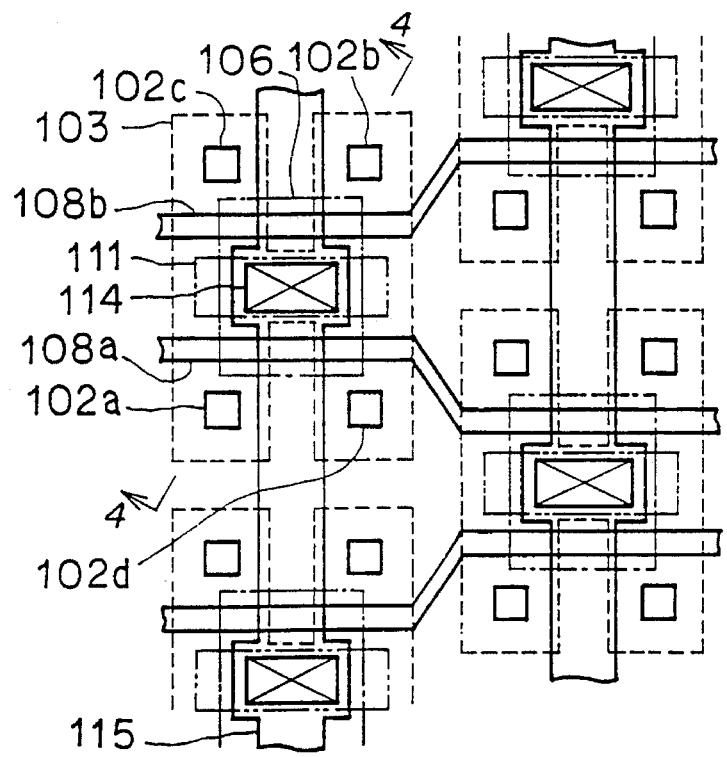
FIG. 3 is a plan view showing an arrangement of memory cells according to a first embodiment of the present invention.
Figure 4:
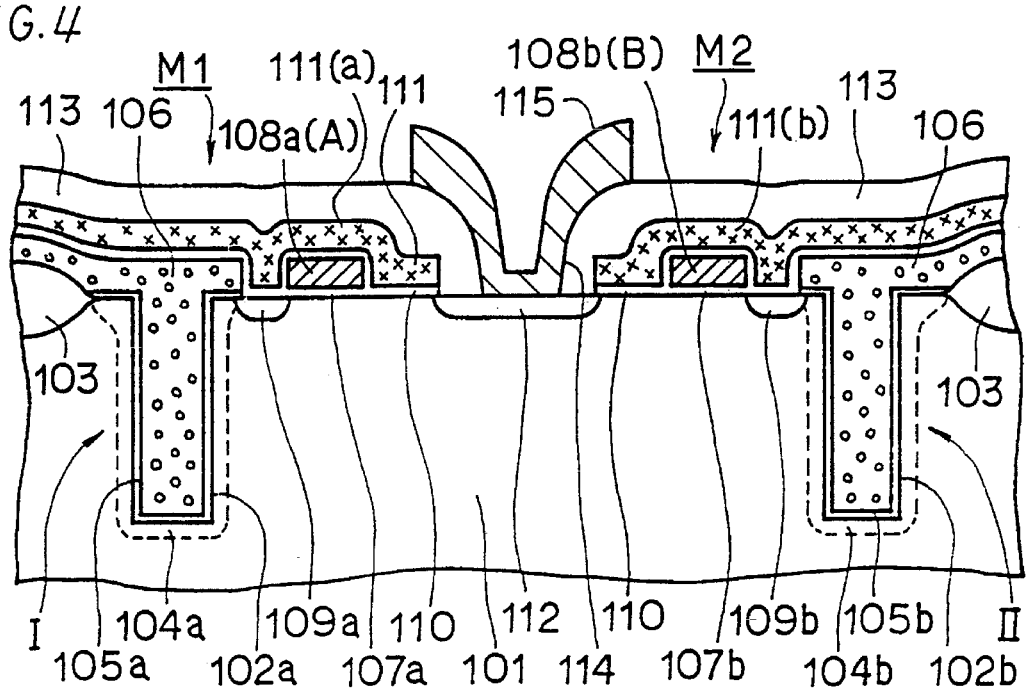
FIG. 4 is a cross sectional view taken along the line 4—4 of FIG. 3.

Referring to FIGS. 3 and 4, a structure of a memory cell in a first embodiment of the present invention will now be described.

Referring to FIG. 3, four trenches 102a–102d are formed to surround a contact hole 114 of a bit line. Four capacitors are formed to surround contact hole 114 of the bit line, corresponding to respective trenches 102a–102d. Each memory cell is formed within an operation region enclosed by a broken line 103. That is, an isolation oxide film is formed in the periphery of the region enclosed by broken line 103. Transfer gates of two MOS transistors constituting two memory cells surrounding contact hole 114 include a part of a word line 108b. Transfer gates of two MOS transistors constituting two memory cells among four memory cells surrounding contact hole 114 include a part of a word line 108a. A sub-transfer gate is formed over the outside of a region enclosed by a chain-two dotted line 111. A cell plate is formed extending all over the outside of a region enclosed by a chain-dotted line 106. A bit line 115 connects the four memory cells through contact hole 114, extending so as to cross word lines 108a and 108b.

Referring to FIGS. 2 and 4, two memory cells M1 and M2 are formed on both sides of contact hole 114 of the bit line. Memory cell M1 includes a transfer gate 108a(A) with a low threshold voltage, a sub-transfer gate 111(a) with a high threshold voltage, and capacitor I. Memory cell M2 includes a transfer gate 108b(B) with a high threshold voltage, a sub-transfer gate 111(b) with a low threshold voltage, and capacitor II. An isolation oxide film 103 is formed in a p type silicon substrate 101 so as to surrounding an operation region including memory cells M1 and M2. Trenches 102a and 102b are formed in p type silicon substrate 101. Making use of trench 102a, capacitor I includes a storage node 104a, a capacitor dielectric film 105a, and a cell plate 106. Also making use of trench 102b, capacitor II includes a storage node 104b, a capacitor dielectric film 105b, and cell plate 106. $N^+$ impurity diffusion regions constituting storage nodes 104a, 104b are formed along the sidewall and bottom-wall surfaces of trenches 102a, 102b, respectively. Capacitor dielectric films 105a and 105b are formed on the sidewall and bottom-wall surfaces of trenches 102a and 102b, respectively. Cell plate 106 is formed to fill trenches 102a, 102b. Transfer gates 108a, 108b are formed on p type silicon substrate 101, with transfer gate oxide films 107a, 107b interposed therebetween, respectively. One source/drain region 109a, 109b is formed in a region between transfer gate 108a and trench 102a, and transfer gate 108b and trench 102b, of silicon substrate 101. Source/drain regions 109a, 109b are formed to connect with storage nodes 104a, 104b, respectively. A sub-transfer gate 111 is formed over silicon substrate 101, with sub-transfer gate oxide film 110 interposed therebetween. The other source/drain region 112 is connected to bit line 115 through contact hole 114. Bit line 115 is formed extending on a interlayer insulating film 113.

A manufacturing method of the memory cell of the first embodiment shown in FIGS. 3 and 4 is hereinafter described.

Figure 5:
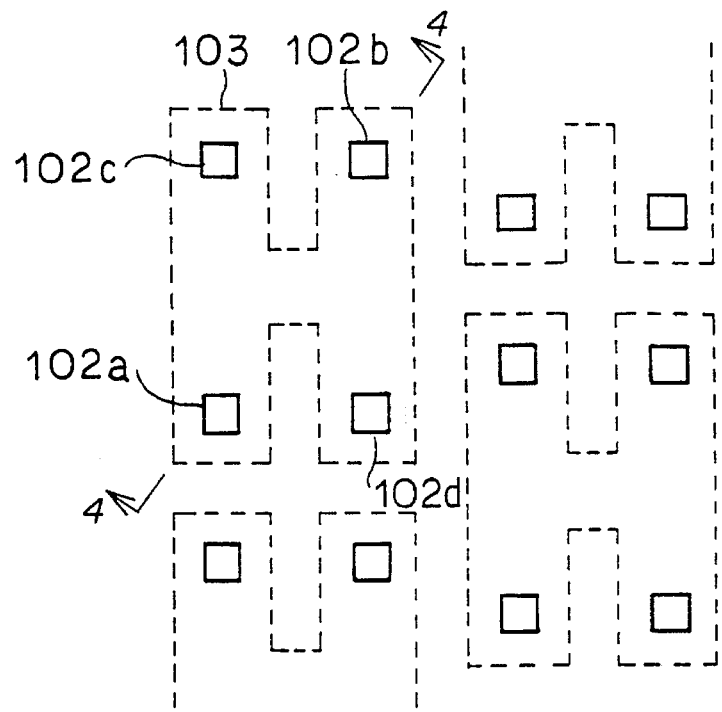
FIGS. 5–8 are partial plan views sequentially showing an arrangement in respective manufacturing steps of the memory cells in the first embodiment (FIG. 3) of the present invention.
Figure 9:
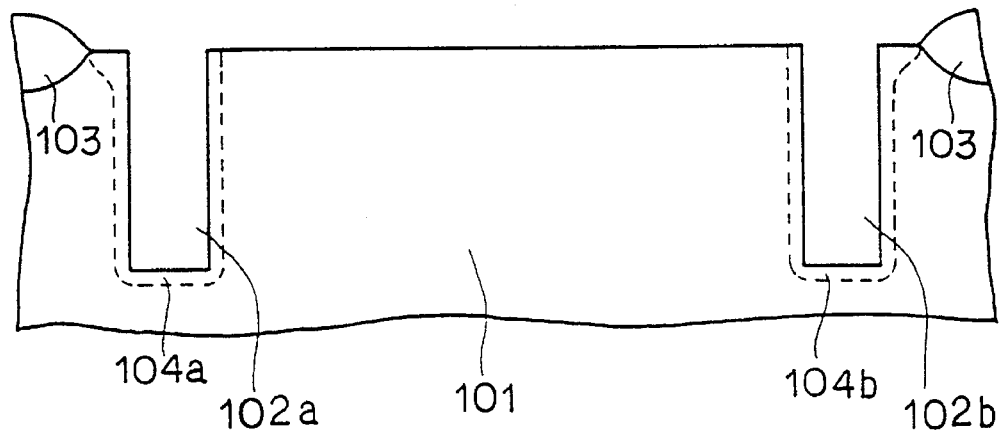
FIGS. 9–14 are partial cross sectional views sequentially showing a cross section in respective manufacturing steps of the memory cell in the first embodiment (FIG. 4) of the present invention.

Referring to FIGS. 5 and 9, isolation oxide film 103 is formed to surround an operation region for four memory cells in a desired position of p type silicon substrate 101. Employing photolithography technology and dry etching technology, trenches 102a–102d for forming four capacitors are formed in desired positions of silicon substrate 101 within the region surrounded by isolation oxide film 103. Thereafter, employing ion implantation technology, $n^+$ impurity diffusion regions 104a, 104b are 30 formed along the sidewall and bottom-wall surfaces of trenches 102a, 102b, respectively.

Figure 6:
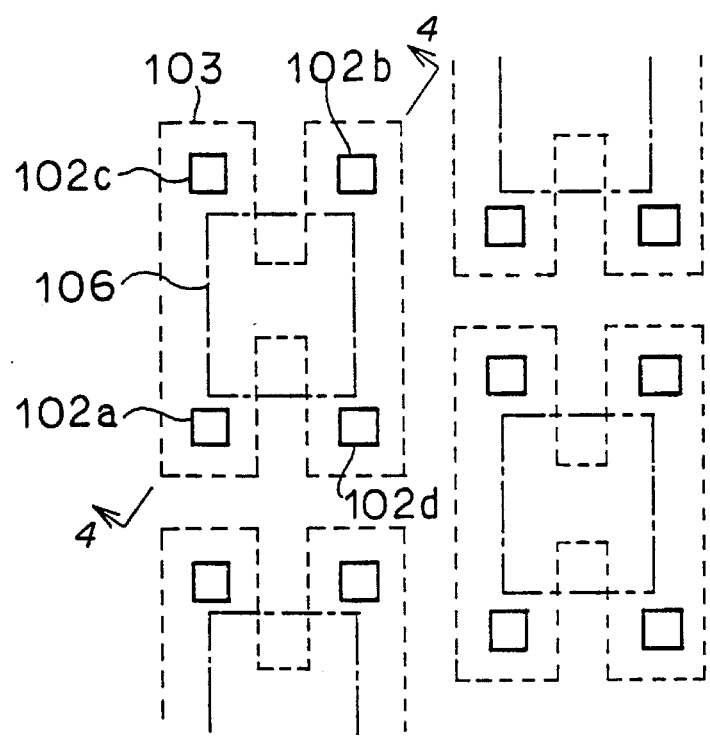
Figure 10:
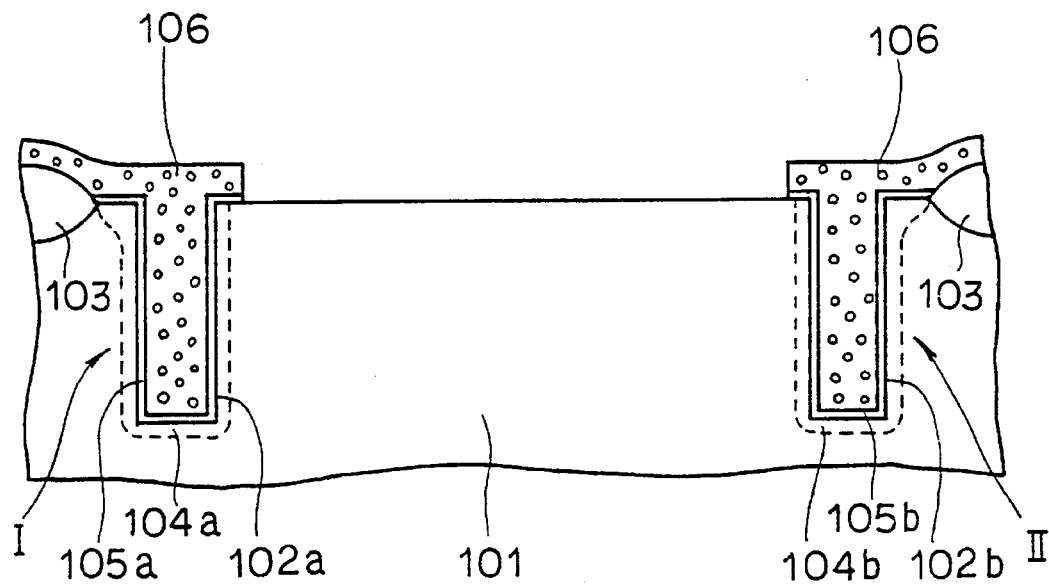

Referring to FIGS. 6 and 10, the whole silicon substrate 101 is oxidized, so that capacitor dielectric films 105a, 105b are formed on the sidewall and bottom-wall surfaces of trenches 102a, 102b, respectively. Subsequently, a polysilicon layer for formation of one electrode (cell plate) of a capacitor is formed over the whole surface of silicon substrate 101, utilizing a LPCVD (depressured CVD) method. A desired photoresist pattern is then formed, and, utilizing it as a mask, the polysilicon layer is subjected to dry etching, whereby cell plate 106 is formed.

Figure 11:
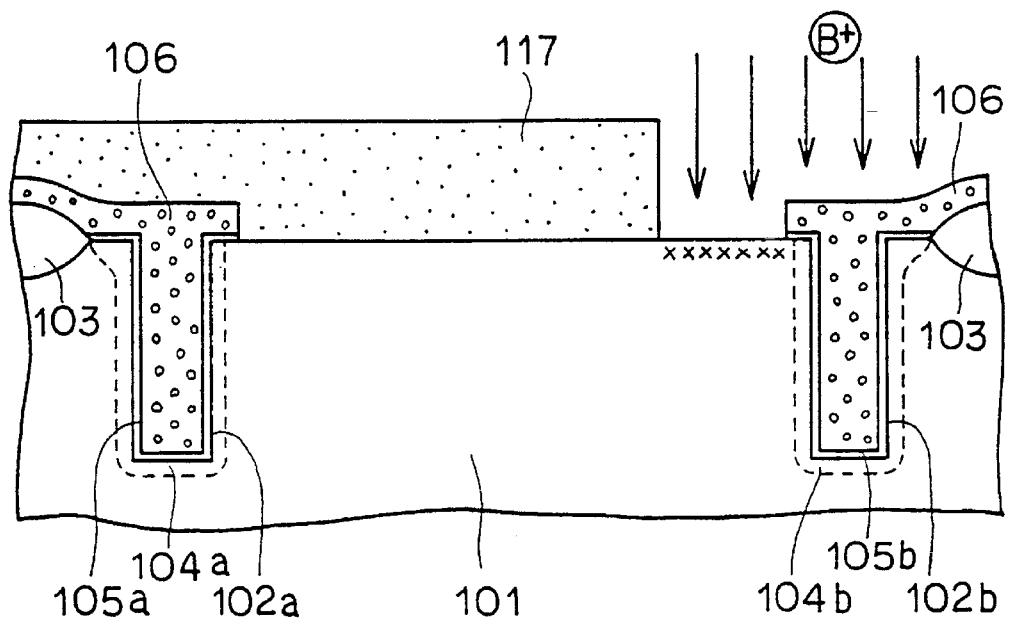

Referring to FIG. 11, a photoresist film 117 is selectively formed over silicon substrate 101 so as to expose only the regions in which transfer gates B, C (FIG. 2), each having a high threshold voltage, are formed. With photoresist film 117 and cell plate 106 as a mask, boron ions ($B^+$) are implanted into silicon substrate 101.

Figure 7:
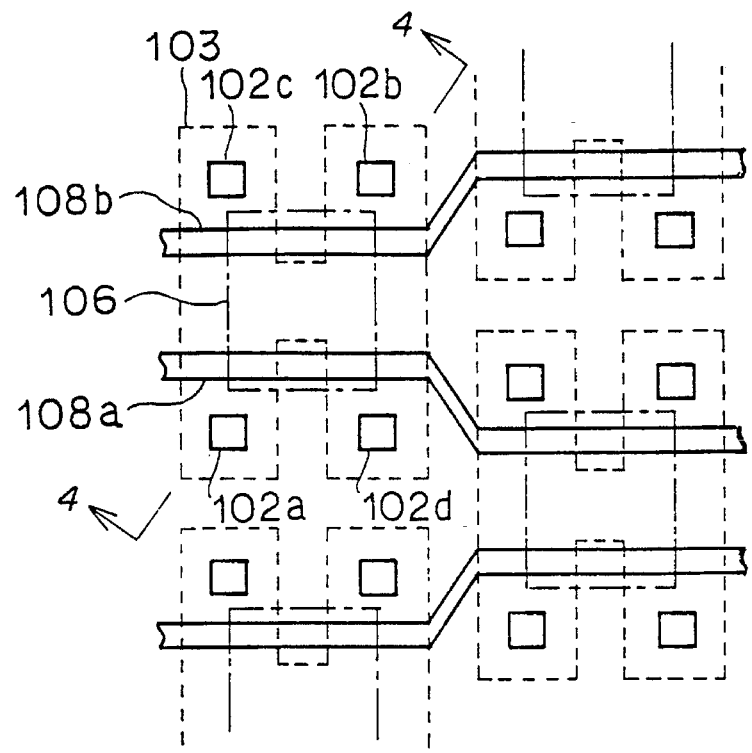
Figure 12:
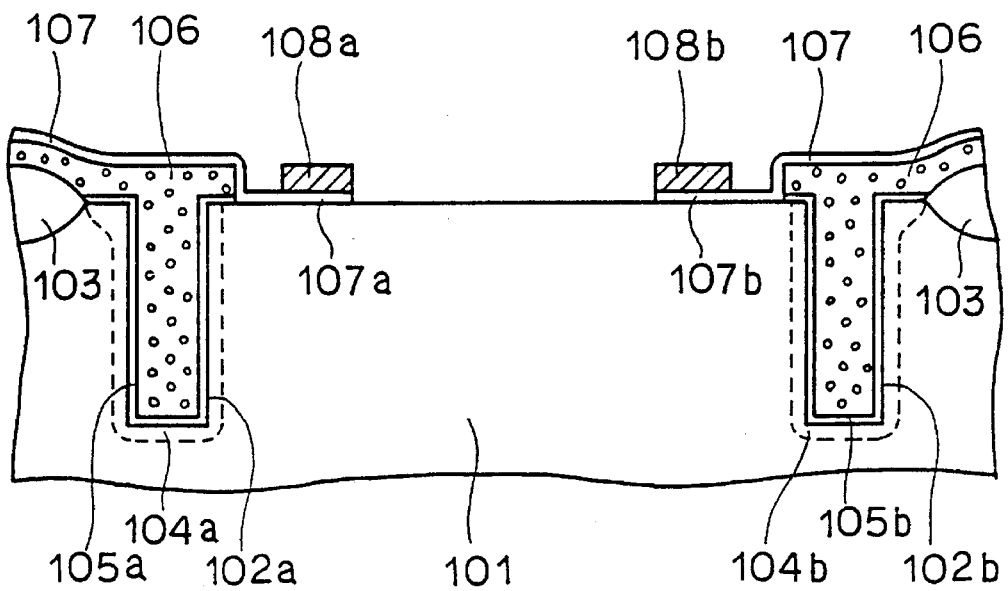

Referring to FIGS. 7 and 12, the whole surface of silicon substrate 101 is oxidized to form transfer gate oxide films 107a, 107b. At this time, the surface of cell plate 106 is also oxidized, and an oxide film 107 is formed. A polysilicon layer is further formed over the whole surface of silicon substrate 101 utilizing a LPCVD method. The polysilicon layer is selectively removed by means of photolithography and dry etching technology, whereby transfer gates (word lines) 108a, 108b are formed.

Figure 13:
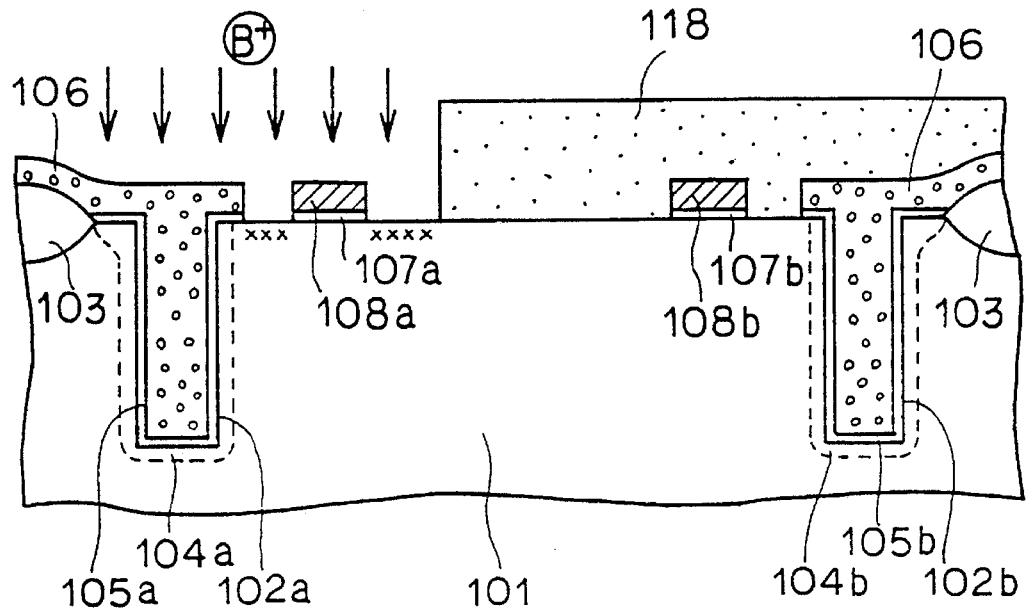

Referring to FIG. 13, a photoresist film 118 is selectively formed on silicon substrate 101 so as to expose only the regions in which sub-transfer gates a, d (FIG. 2), each having a high threshold voltage, are formed. With cell plate 106, transfer gate 108a, and photoresist film 118 as a mask, boron ions ($B^+$) are selectively implanted into silicon substrate 101.

Figure 8:
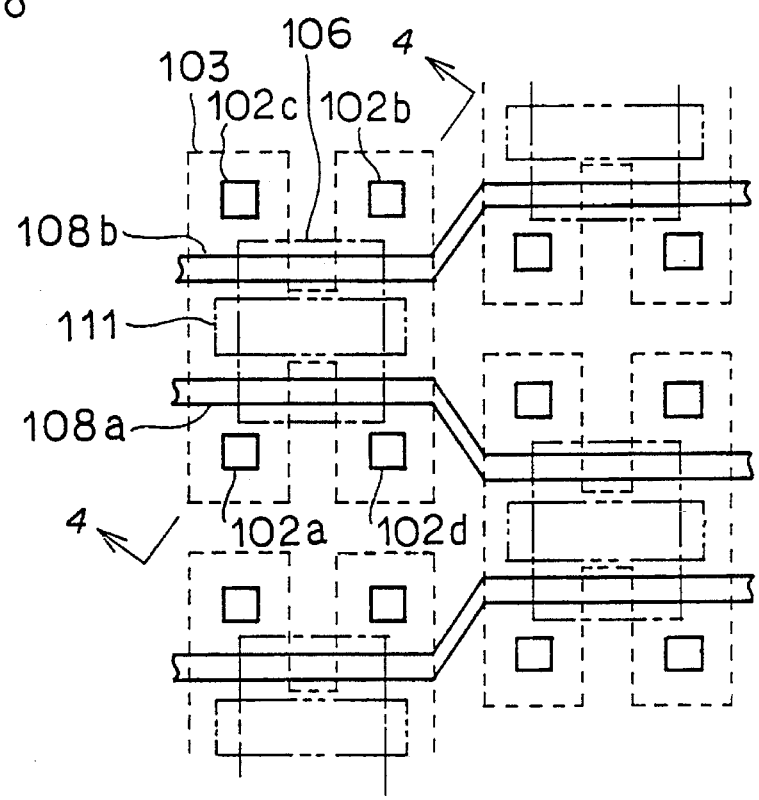
Figure 14:
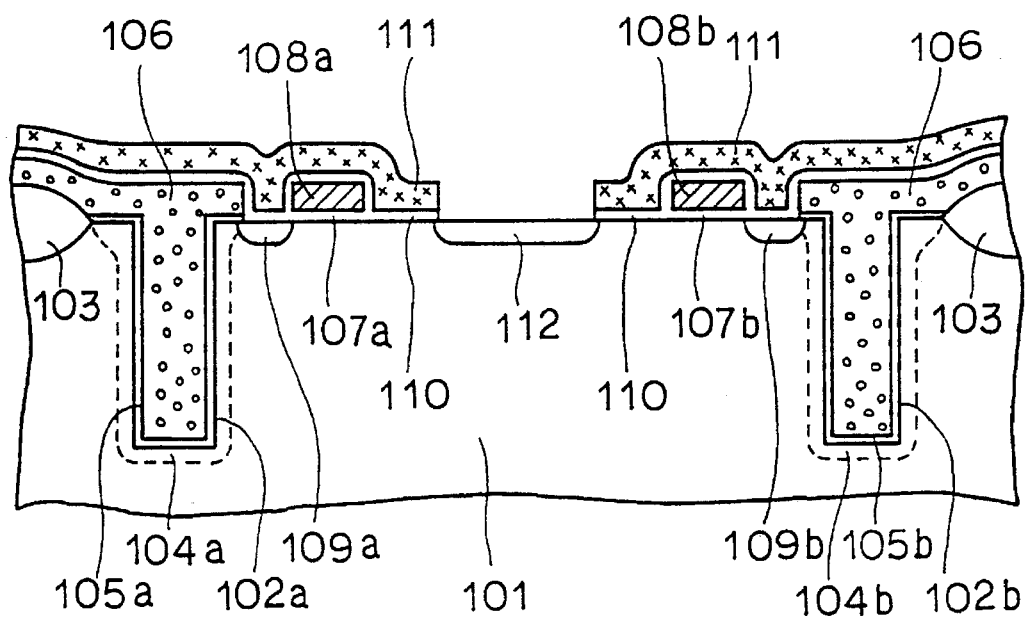

Thereafter, referring to FIGS. 8 and 14, after removing photoresist film 118, arsenic ions ($As^+$) or phosphorus ions ($P^+$) as n type impurities, are implanted into a region exposed between transfer gates 108a, 108b and cell plate 106 of silicon substrate 101, whereby source/drain regions 109a, 109b as n type impurity diffusion regions are formed. The whole surface of silicon substrate 101 is oxidized, and a sub-transfer gate oxide film 110 is formed. Subsequently, a polysilicon layer is formed over the whole surface of silicon substrate 101. The polysilicon layer is patterned, and a sub-transfer gate 111 is formed. Arsenic ions ($As^+$) or phosphorus ions ($P^+$), which are n type impurities, are implanted into a region, exposed from sub-transfer gates 111, of silicon substrate 101, whereby a source/drain region 112 of a n type impurity diffusion region is formed.

Finally, an interlayer insulating film 113 is formed as shown in FIG. 4. Contact hole 114 is formed on interlayer insulating film 113 to expose the surface of source/drain region 112. Bit line 115 is formed through contact hole 114 so as to contact with source/drain region 112. Bit line 115 is made of aluminum alloy or metal silicide. Interlayer insulating film 113 is made of an oxide film formed by a CVD method.

As described above, the memory cell structure of the present invention having a trench type capacitor is manufactured.

Embodiment 2

Figure 15:
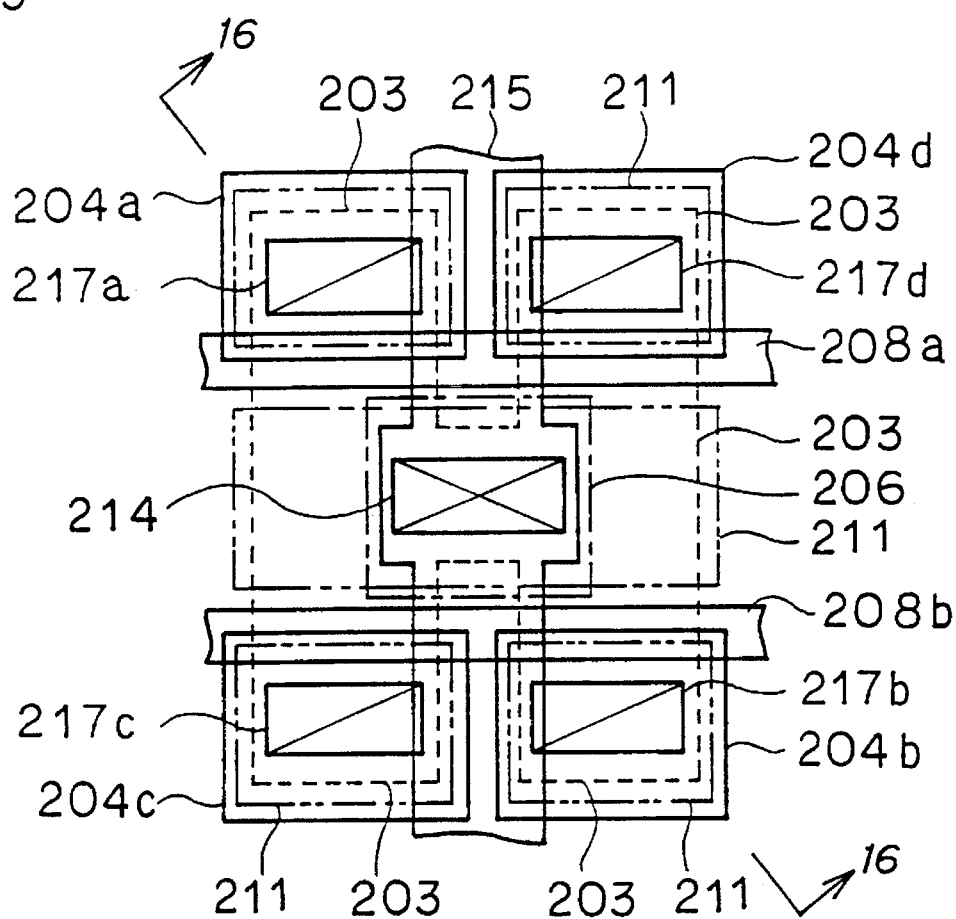
FIG. 15 is a plan view showing an arrangement of memory cells of a second embodiment of the present invention.
Figure 16:
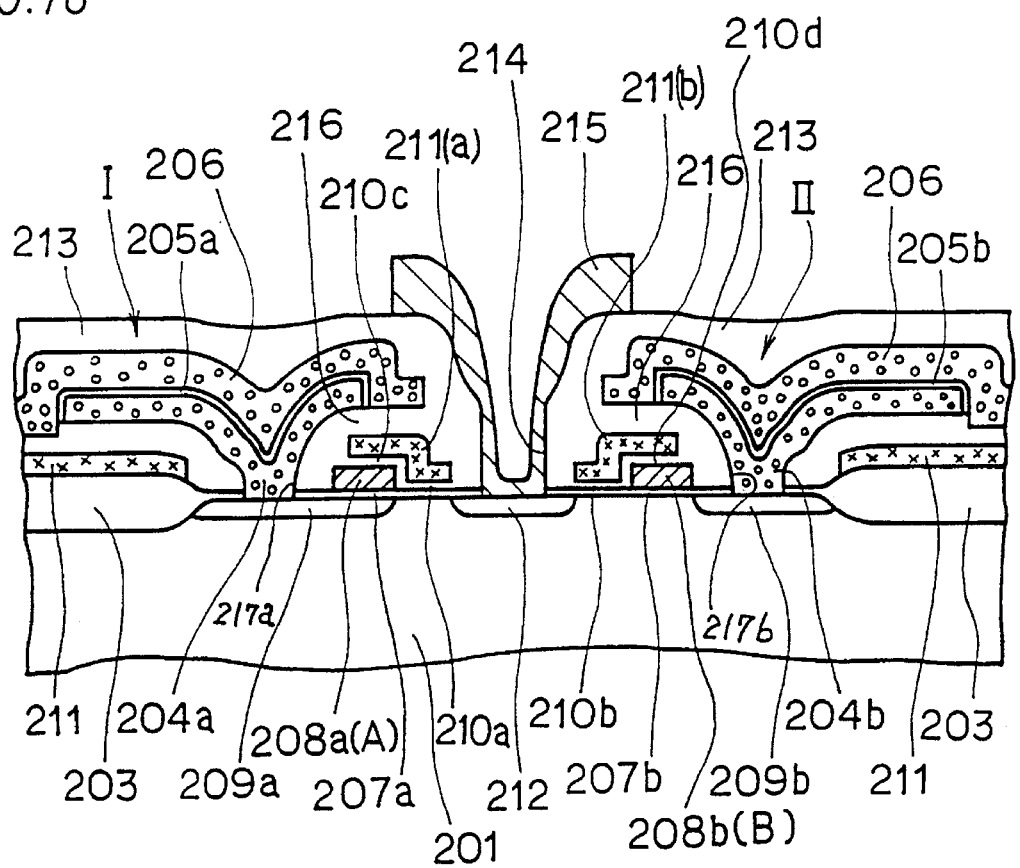
FIG. 16 is a cross sectional view taken along the line 16—16 of FIG. 15.

Referring to FIGS. 15 and 16, a memory cell structure with a stack type capacitor of a second embodiment will now be described.

Referring FIG. 15, four capacitors are arranged to surround a contact hole 214 of a bit line. Each capacitor has a storage node 204a, 204b, 204c or 204d. An operation region of each of the four memory cells surrounding contact hole 214 is formed in a region surrounded by a broken line 203. In other words, an isolation oxide film is formed outside the region surrounded by broken line 203. Transfer gates of two MOS transistors constituting two memory cells located on the upper side of contact hole 214 include a part of a word line 208a, while transfer gates of two MOS transistors constituting two memory cells located on the lower side of contact hole 214 include a part of a word line 208b. Storage node contact holes 217a, 217d are formed on the upper side of word line 208a. Storage node contact hole 217c, 217b are formed on the lower side of word line 208b. Storage nodes 204a–204d are formed to contact with source/drain regions of the MOS transistors through storage node contact holes 217a–217d, respectively. A cell plate is arranged outside a region surrounded by a chain-dotted line 206. A sub-transfer gate is formed outside a region surrounded by a chain-two dotted line 211. A bit line 215 is connected to the four memory cells through contact hole 214, extending to cross word lines 208a, 208b.

Referring to FIGS. 2 and 16, two memory cells M1 and M2 are formed on both sides of contact hole 214 of the bit line. Memory cell M1 includes a MOS transistor including a transfer gate 208a(A) and a sub-transfer gate 211(a), and capacitor I. Memory cell M2 includes a MOS transistor including a transfer gate 208b(B) and a sub-transfer gate 211(b), and capacitor II. An isolation oxide film 203 is formed in a p type silicon substrate 201 to surround operation regions of four memory cells. Transfer gates 208a and 208b are formed on silicon substrate 201 with transfer gate oxide films 207a and 207b interposed therebetween, respectively. Sub-transfer gate 211 is formed on transfer gates 208a, 208b with oxide films 210c, 210d interposed therebetween, and on silicon substrate 201 with sub-transfer gate oxide films 210a, 210b interposed therebetween. One source/drain region 209a, 209b of each field effect transistor is connected to capacitors I, II through storage node contact holes 217a, 217b, respectively. Capacitor I includes storage node 204a formed to connect with source/drain region 209a, a capacitor dielectric film 205a, and cell plate 206. Capacitor II includes storage node 204b formed to connect with source/drain region 209b, a capacitor dielectric film 205b, and cell plate 206. The other source/drain region 212 is formed in silicon substrate 201 in the vicinity of sub-transfer gate 211. An interlayer insulating film 213 is formed to cover capacitors I and II. Contact hole 214 is formed on interlayer insulating film 213 to expose the surface of source/drain region 212. Bit line 215 is formed to contact with source/drain region 212 through contact hole 214.

A manufacturing method of the memory cell having the stack type capacitor of the second embodiment shown in FIGS. 15 and 16 will hereinafter be described.

Figure 19:
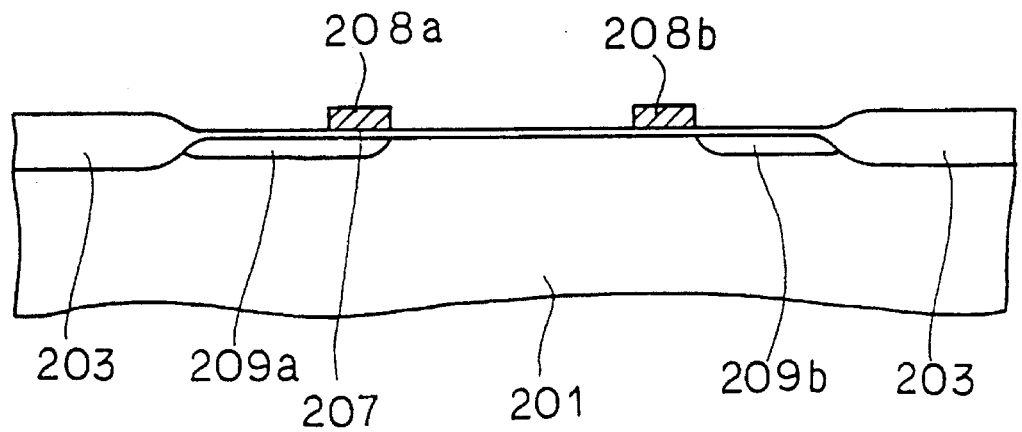
FIGS. 19–24 are cross sectional views sequentially showing a cross section in respective manufacturing steps of the memory cell in the second embodiment (FIG. 16) of the present invention.

Referring to FIG. 19, isolation oxide film 203 is formed in p type silicon substrate 201 to surround the operation region of the four memory cells. Transfer gates (word lines) 208a, 208b are formed on silicon substrate 201 with transfer gate oxide film 207 interposed therebetween. One source/drain regions 209, 209b is formed.

Figure 20:
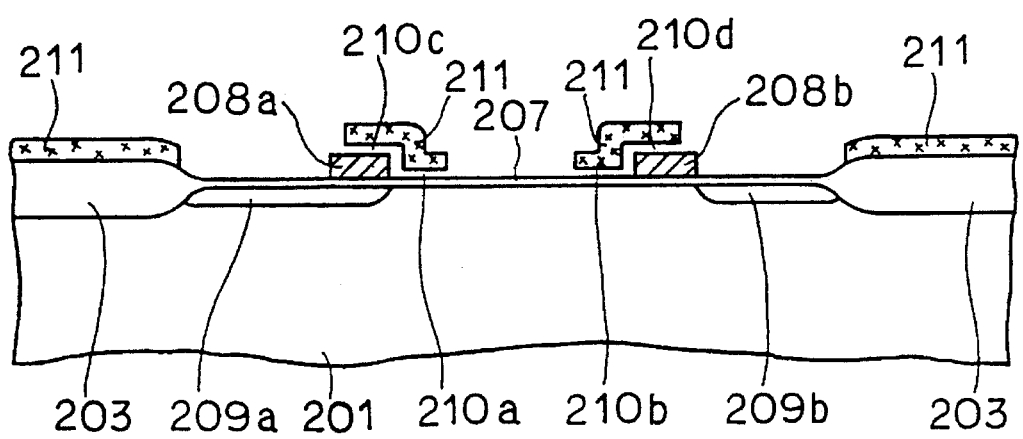

Referring to FIG. 20, sub-transfer gate 211 is formed on transfer gates 208a, 208b with oxide films 210c, 210d interposed therebetween, on silicon substrate 201 with sub-transfer gate oxide films 210a, 210b interposed therebetween, and on isolation oxide film 203.

Implantation of boron ions or the like for controlling each threshold voltage of transfer gates 208a, 208b and sub-transfer gate 211 is carried out in the above described process.

Figure 17:
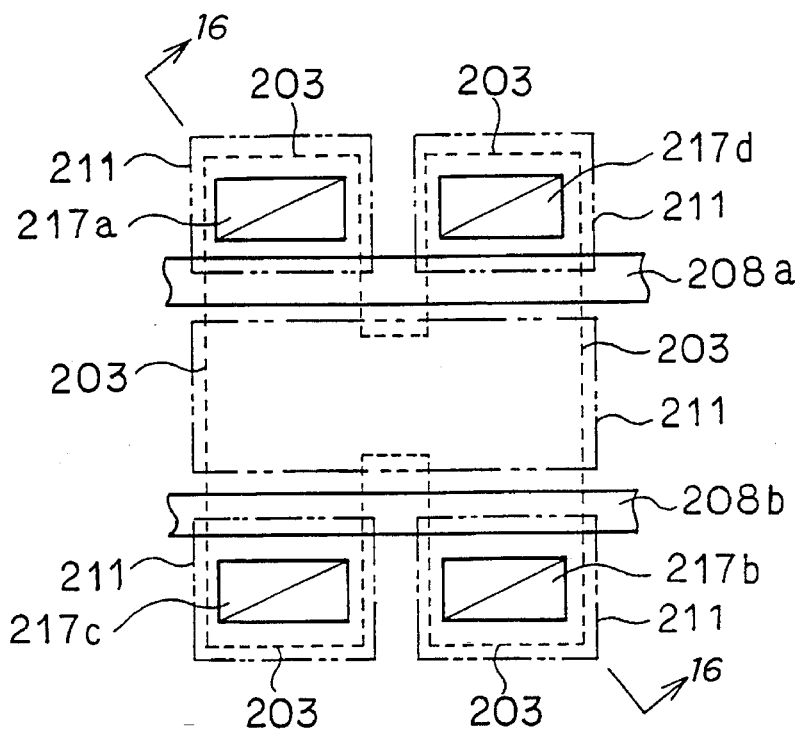
FIGS. 17 and 18 are partial plan views sequentially showing an arrangement in respective manufacturing steps of the memory cell in the second embodiment (FIG. 15) of the present invention.
Figure 21:
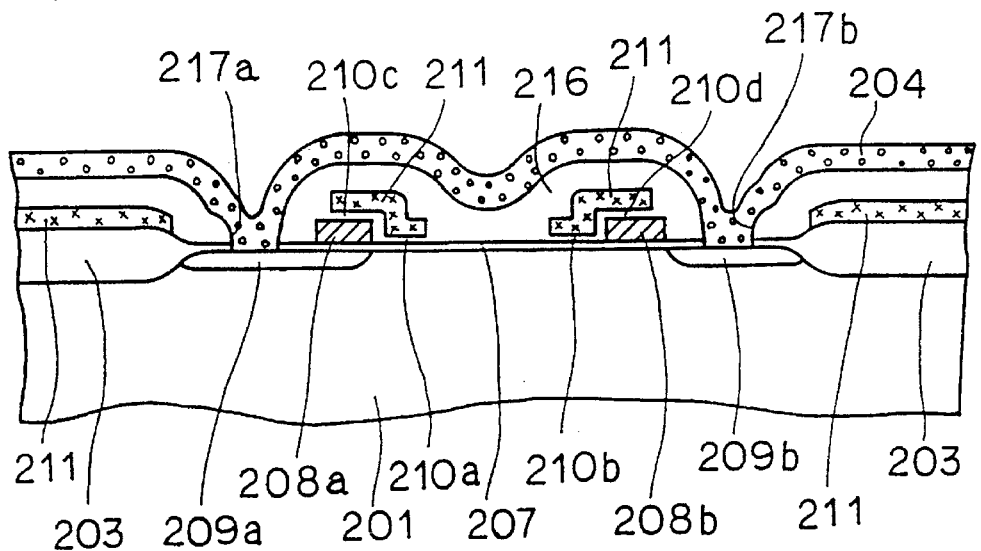

Referring to FIGS. 17 and 21, storage node contact holes 217a, 217b (217c, 217d) are formed on an interlayer insulating film 216 to expose the surfaces of one source/drain regions 209a, 209b. A layer for storage node 204 is formed on interlayer insulating film 216 to contact with source/drain regions 209a, 209b.

Figure 22:
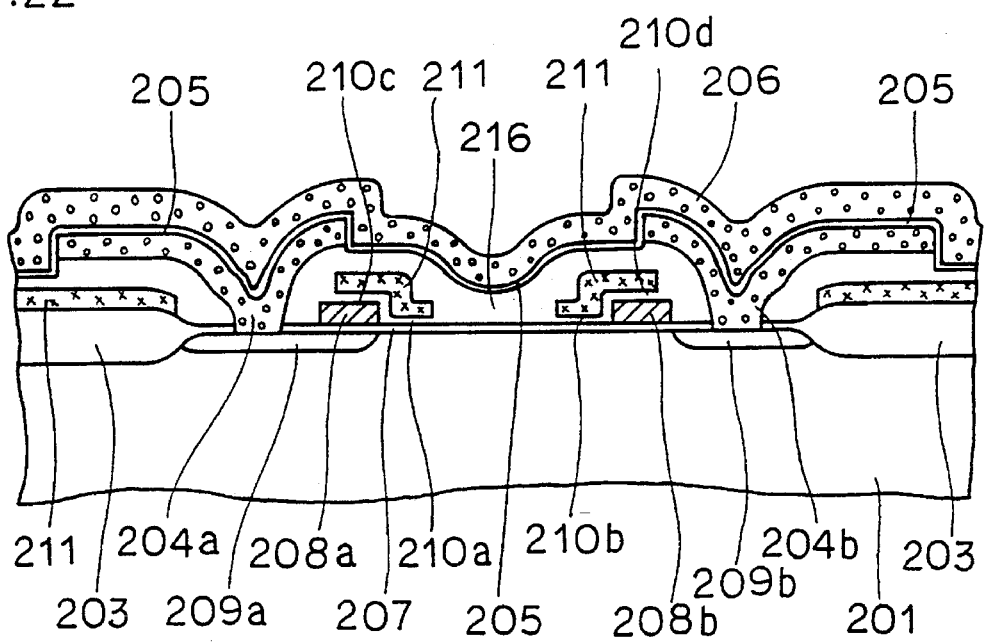

Referring to FIG. 22, storage nodes 204a, 204b are formed by selectively removing the layer 204 according to a desired pattern. Capacitor dielectric film 205 is formed over the whole surface. Cell plate 206 is formed on a capacitor dielectric film 205.

Figure 18:
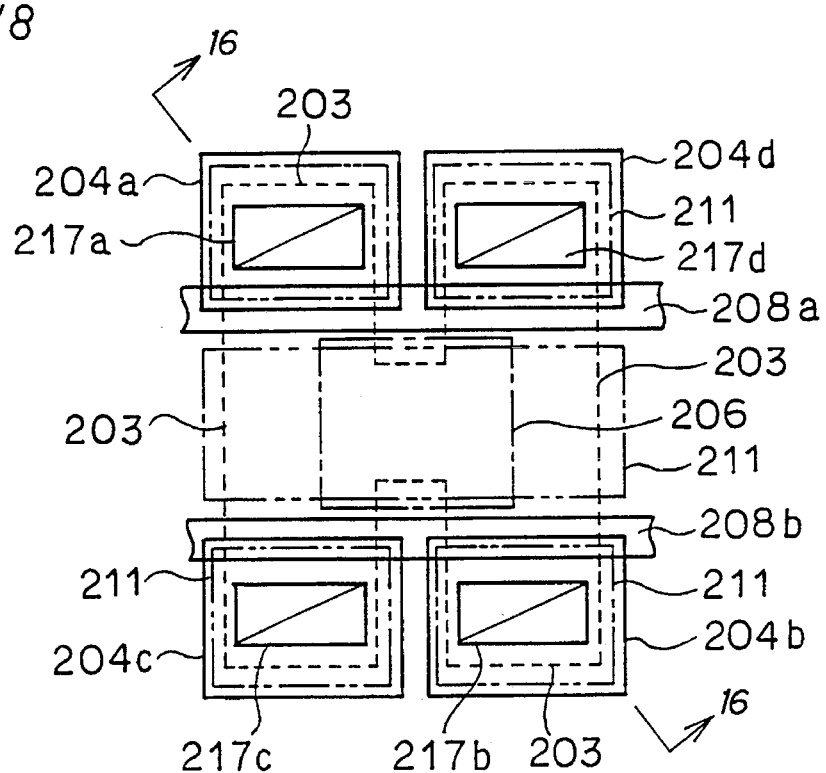
Figure 23:
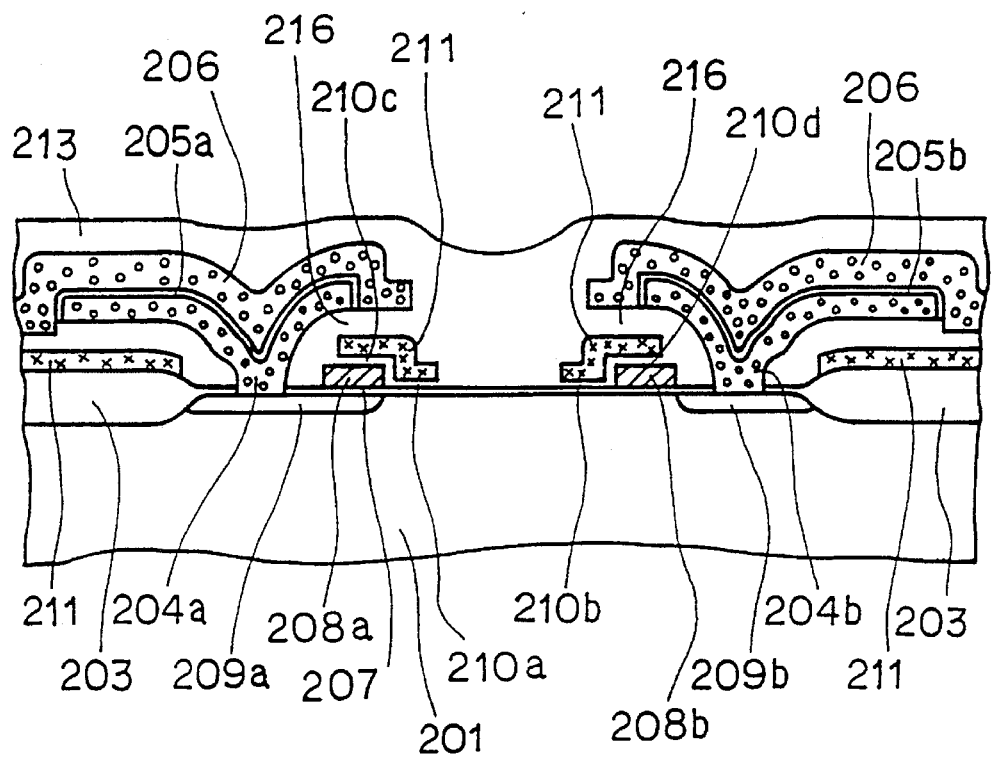

Referring to FIGS. 18 and 23, cell plate 206 is selectively removed according to a desired pattern (by removing only the region surrounded by a chain-dotted line of FIG. 18).

Thereafter, interlayer insulating film 213 is formed over the whole surface.

Figure 24:
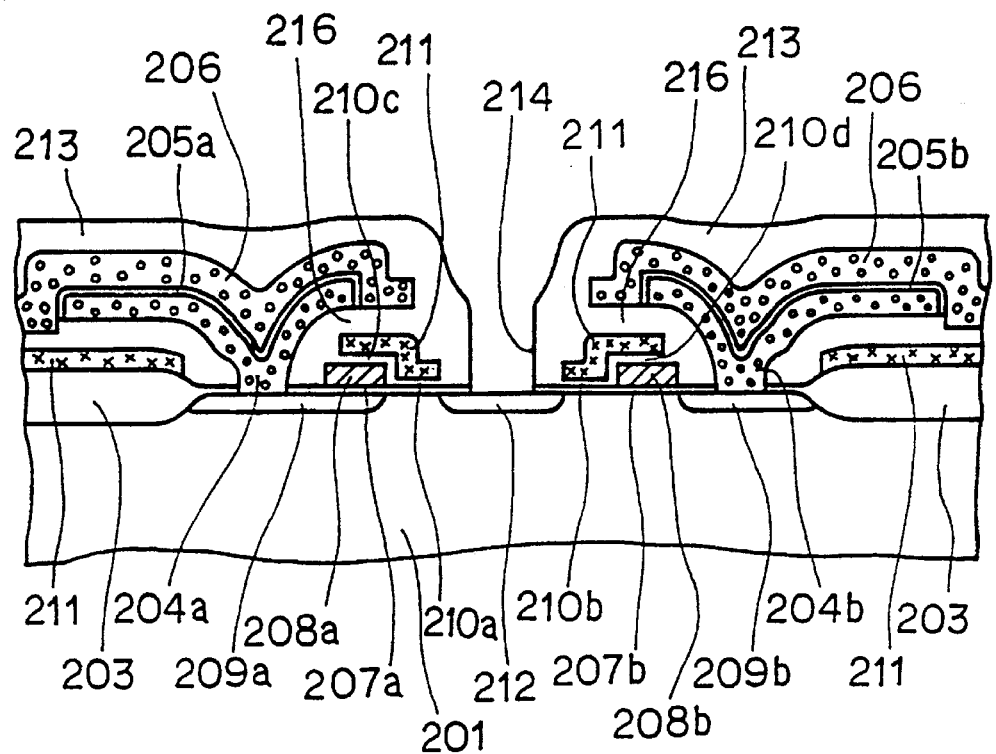
Figure 25:
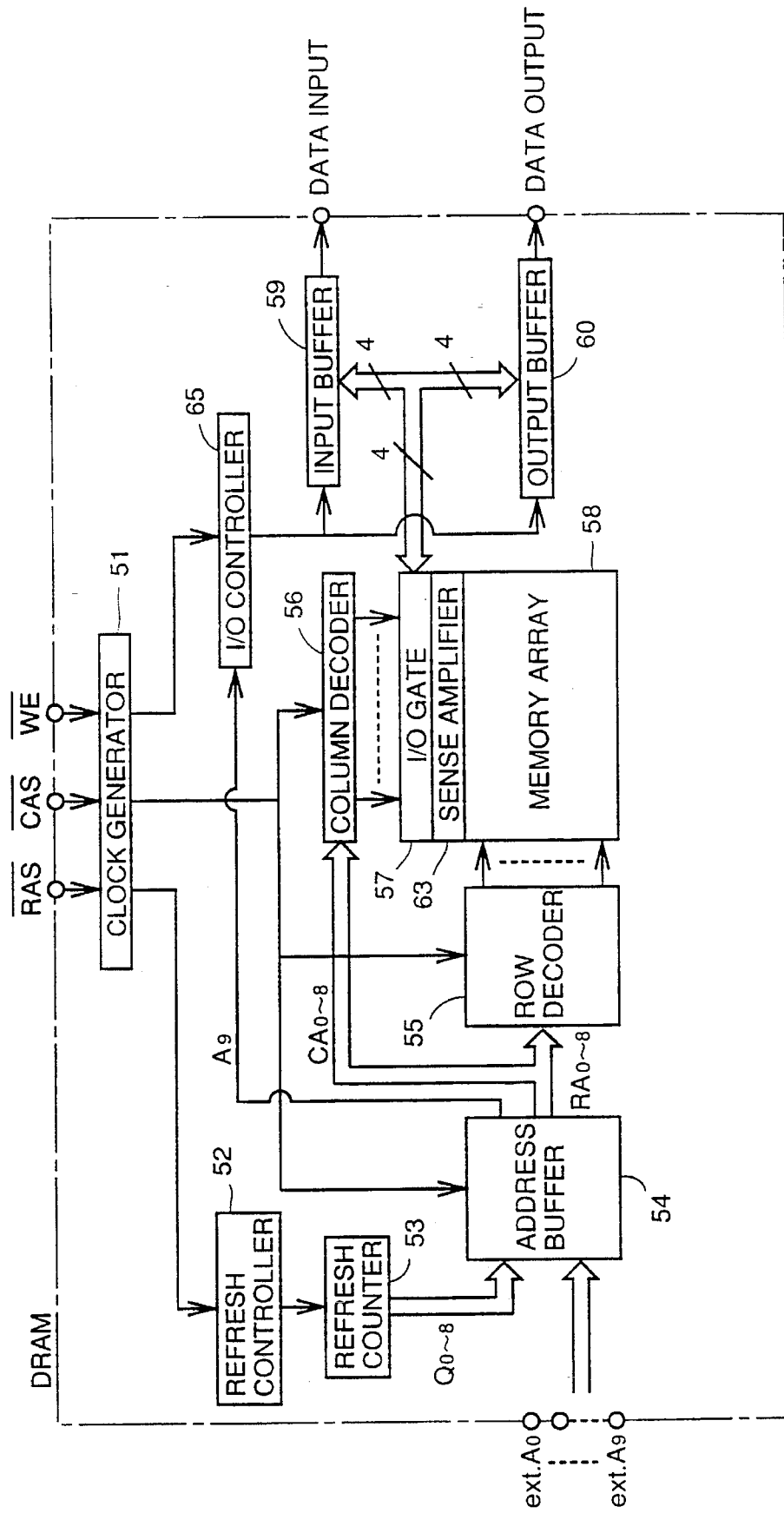
FIG. 25 is a schematic block diagram showing a general structure of a conventional DRAM.
Figure 26:
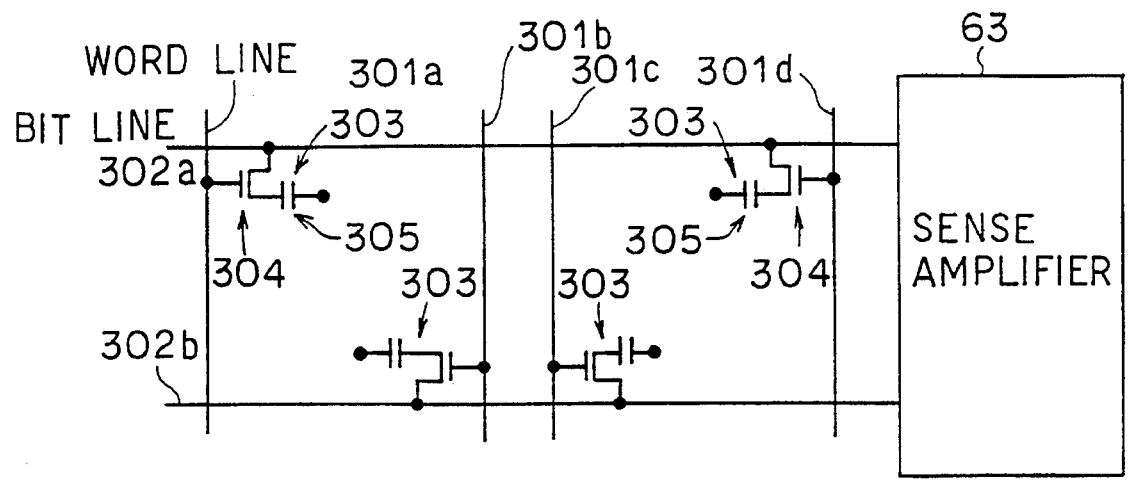
FIG. 26 is a schematic diagram of an equivalent circuit showing four-bit memory cell structure of the DRAM shown in FIG. 25.
Figure 27:
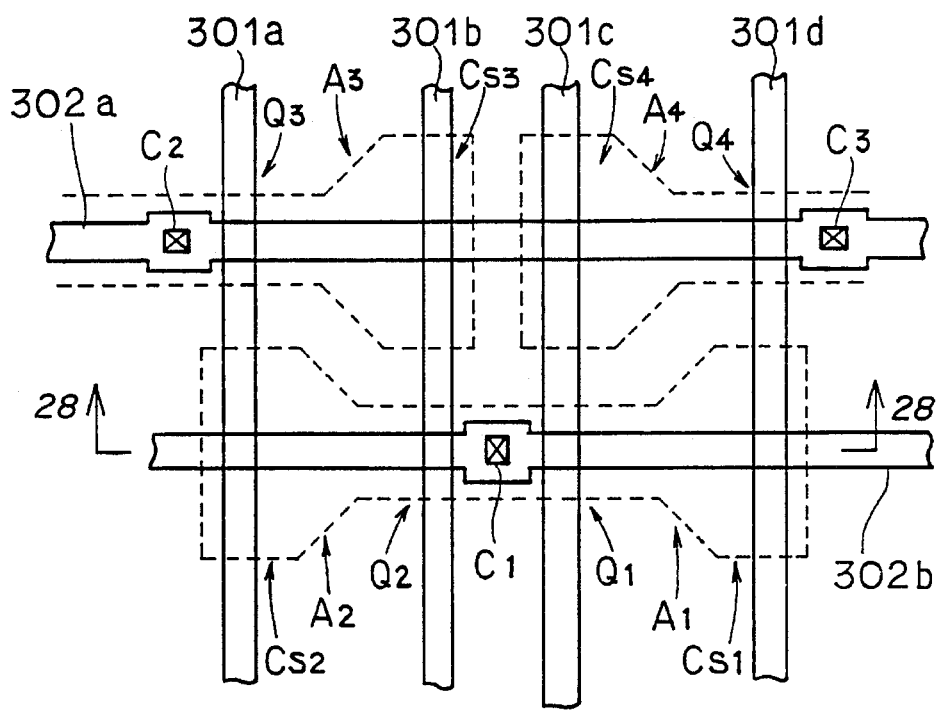
FIG. 27 is a partial plan view showing an arrangement of the memory array shown in FIG. 26.
Figure 28:
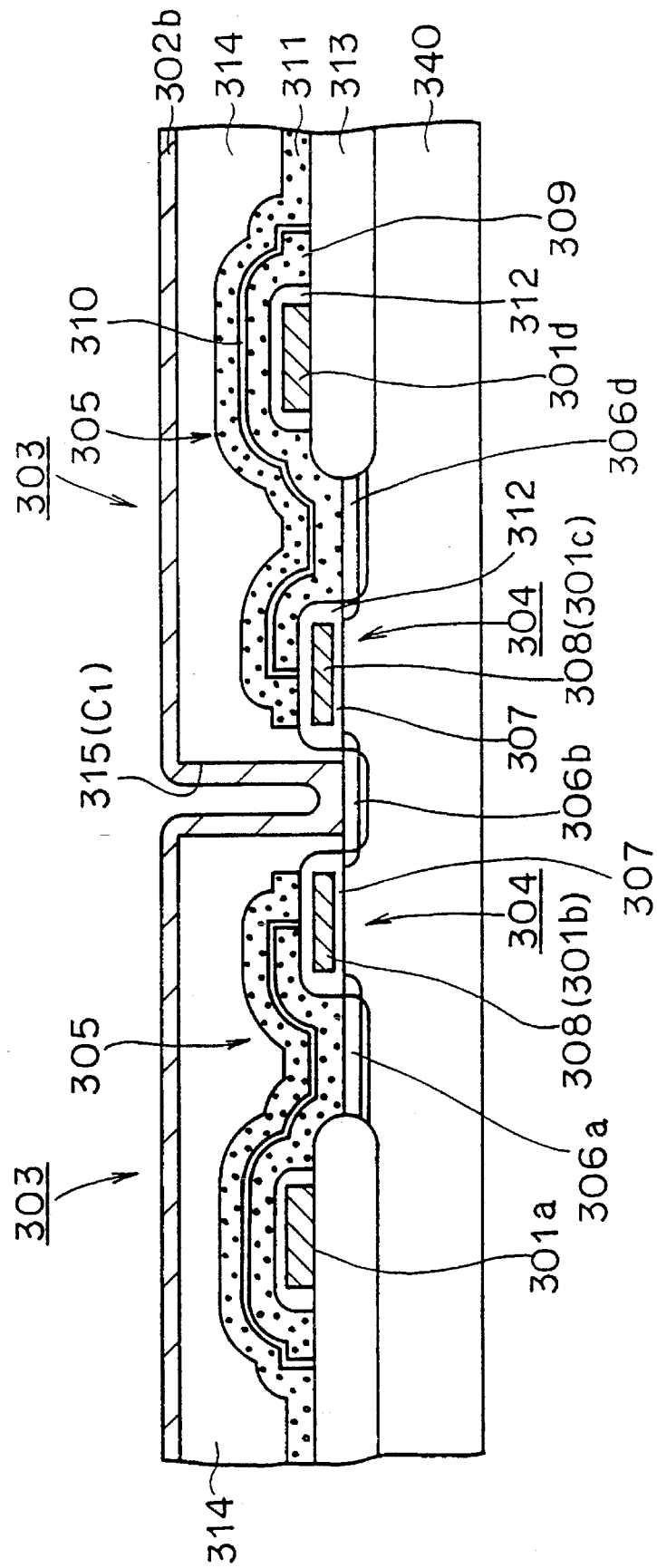
FIG. 28 is a partial cross sectional view taken along the line 28—28 of FIG. 27.

Referring to FIG. 24, contact hole 214 is formed on interlayer insulating film 213 so that the surface of source/drain region 212 is exposed.

Referring to FIGS. 15 and 16, bit line 215 is formed to contact with source/drain region 212 through contact hole 214.

The memory cell structure of the present invention having a stack type capacitor is thus manufactured.

A sub-transfer gate and a transfer gate formed in the above embodiment and having two threshold voltages respectively, are controlled so that each has a gate length, a gate oxide film thickness, and a channel impurity concentration as shown in Table 2.

TABLE 2

|  | gate length | gate oxide film thickness | channel impurity concentration |
|---|---|---|---|
| transfer gate |  |  |  |
| low Vth | 0.5–2.0 μm | 100–200Å | $5 \times 10^{14}$–$5 \times 10^{15}$/cm$^3$ |
| high Vth | " | " | $1 \times 10^{15}$–$1 \times 10^{16}$/cm$^3$ |
| sub-transfer gate |  |  |  |
| low Vth | 0.5–2.0 μm | 100–250Å | $5 \times 10^{14}$–$5 \times 10^{15}$/cm$^3$ |
| high Vth | " | " | $1 \times 10^{15}$–$1 \times 10^{16}$/cm$^3$ |

According to the memory cell structure of the present invention, addition of a sub-transfer gate is considered to lead to oversize of a memory cell compared with a conventional one. In a four or more megabit DRAM, however, a size of a memory cell rather depends on a size of a wide/a space of bit lines and word lines. Therefore, according to the present invention, the number of bit lines is reduced to half of that of a conventional one, and a space between bit lines is also reduced to approximately half, and thus the memory cell structure of the present invention can contribute to high integration of a DRAM.

As described above, according to the present invention, a memory cell including two gate electrodes having two different threshold voltages is configured, enabling the number of bit line contacts to be reduced compared to that of a conventional memory cell structure, and consequently preventing reduction of reliability such as increase of a contact resistance by high integration and miniaturization of a semiconductor memory device. The memory cell structure of the present invention thus contributes to high integration of a semiconductor memory device.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A DRAM in which a plurality of memory cells are provided on the main surface of a semiconductor substrate, wherein each of said memory cells comprises a field effect transistor and a capacitor separate from said trnsistor and connected thereto, said field effect transistor including a first gate electrode having a first threshold voltage, and a second gate electrode having a second threshold voltage different from said first threshold voltage.

2. The DRAM according to claim 1, wherein said first gate electrodes are interconnected among said plurality of memory cells.

3. The DRAM according to claim 1, wherein said field effect transistor comprises said first gate electrode and said second gate electrode formed on the main surface of said semiconductor substrate with a gate insulating film interposed therebetween, and insulted adjacent to each other, and first and second impurity regions formed in the main surface of said semiconductor substrate, spaced from each other by said first and second gate electrodes.

4. The DRAM according to claim 3, wherein said first impurity region is shared among four of said memory cells.

5. A DRAM in which a plurality of memory cells are provided on the main surface of a semiconductor substrate, wherein each of said memory cells comprises a field effect transistor and a capacitor connected thereto, said field effect transistor including a first gate electrode having a first threshold voltage, and a second gate electrode having a second threshold voltage different from said first threshold voltage, wherein said field effect transistor comprises said first gate electrode and said second gate electrode formed on the main surface of said semiconductor substrate with a gate insulating film interposed therebetween, and insulated adjacent to each other, and first and second impurity regions formed in the main surface of said semiconductor substrate, spaced from each other by said first and second gate electrodes, and wherein said capacitor comprises a first capacitor electrode connected to said second impurity region, a dielectric film formed on said first capacitor electrode, and a second capacitor electrode formed on said dielectric film.

6. The DRAM according to claim 5, wherein said first capacitor electrode comprises a impurity region formed along a bottom-wall and sidewall of a trench of said semiconductor substrate.

7. The DRAM according to claim 5, wherein said first capacitor electrode comprises a conductive layer formed extending over said semiconductor substrate.

8. The DRAM according to claim 5, wherein said first gate electrode comprises a portion extending over said second gate electrode and said second capacitor electrode.

9. The DRAM according to claim 5, wherein said first capacitor electrode comprises a portion extending over said first and second gate electrodes.

10. A DRAM, comprising:

first and second word lines extending in a first direction;

a bit line extending in a second direction crossing said first direction;

first and second memory cells provided at an intersection of said first word line and said bit line; and third and fourth memory cells provided at an intersection of said second word line and said bit line;

wherein said first memory cell comprises a first field effect transistor and a first capacitor connected thereto, said first field effect transistor including a first gate electrode having a first threshold voltage and a second gate electrode having a second threshold voltage lower than said first said threshold voltage, said second memory cell comprises a second field effect transistor and a second capacitor connected thereto, said second field effect transistor including a third gate electrode having said second threshold voltage and a fourth gate electrode having said first threshold voltage, said third memory cell comprises a third field effect transistor and third capacitor connected thereto, said third field effect transistor including a fifth gate electrode having said second threshold voltage and a sixth gate electrode having said first threshold voltage, said fourth memory cell comprises a fourth field effect transistor and a fourth capacitor connected thereto, said fourth field effect transistor including a seventh gate electrode having said first threshold voltage and a eighth gate electrode having said second threshold voltage, said first, third, fifth and seventh gate electrodes are interconnected with each other, said second and fourth gate electrodes are connected to said first word line, and said sixth and eighth gate electrodes are connected to said second word line, and said first, second, third and fourth field effect transistors are connected to said bit line.

11. A DRAM in which a plurality of memory cells are provided on the main surface of a semiconductor substrate, wherein each of said memory cells comprises a field effect transistor and a discrete capacitor connected in series, said field effect transistor including a first gate electrode having a first threshold voltage, and a second gate electrode having a second threshold voltage different from said first threshold voltage.

* * * * *